(12) United States Patent
Starodubov et al.

(10) Patent No.: US 6,344,298 B1
(45) Date of Patent: Feb. 5, 2002

(54) CIRCUMFERENTIALLY VARYING MASK AND FABRICATION OF FIBER GRATINGS USING A MASK

(75) Inventors: Dmitry Starodubov, Los Angeles; Jack Feinberg, Manhattan Beach; Anton Skorucak, Studio City, all of CA (US)

(73) Assignee: Sabeus Photonics, Inc., Long Beach, CA (US)

( * ) Notice: Subject to any disclaimer, the term of this patent is extended or adjusted under 35 U.S.C. 154(b) by 0 days.

(21) Appl. No.: 09/383,332

(22) Filed: Aug. 26, 1999

(51) Int. Cl.[7] .............................. G03F 9/00; A61N 5/00; G21G 5/00; G21R 5/10; G02B 5/18
(52) U.S. Cl. .................. 430/5; 250/492.1; 250/492.22; 385/37; 359/573
(58) Field of Search .................. 430/5, 322; 716/19–21; 385/37, 10; 250/492.1, 492.2; 359/341.1, 569, 573

(56) References Cited

U.S. PATENT DOCUMENTS

| | | | | |
|---|---|---|---|---|
| 5,367,588 A | | 11/1994 | Hill et al. ...................... 385/37 |
| 5,857,043 A | * | 1/1999 | Cook et al. ..................... 385/37 |
| 5,881,186 A | | 3/1999 | Starodubov .................... 385/37 |
| 6,160,261 A | * | 12/2000 | Hoshino ..................... 250/492.1 |
| 6,174,648 B1 | * | 1/2001 | Terao et al. ................. 430/321 |

FOREIGN PATENT DOCUMENTS

WO    WO 97/26570    7/1997

* cited by examiner

*Primary Examiner*—S. Rosasco
(74) *Attorney, Agent, or Firm*—Hale and Dorr LLP

(57) ABSTRACT

A mask for forming gratings in an optical fiber has a pattern that is circumferentially varying about a central axis or region.

34 Claims, 6 Drawing Sheets

CIRCUMFERENTIALLY VARYING MASK AND FABRICATION OF FIBER GRATINGS USING A MASK

BACKGROUND OF THE INVENTION

The present invention relates to the fabrication of gratings in optical waveguides, specifically to the use of masks to write such gratings.

Optical fibers are now widely used for carrying light signals in optical communication systems. Gratings in the fibers are used to control those light signals. Fiber gratings can serve as filters, routers, modulators, and attenuators. Fiber gratings are also used to process the different channels in a wavelength-division multiplexed telecommunication system. Optical fiber gratings can also be used to control the output of lasers.

An important application for fiber gratings is dispersion compensation in high-speed telecommunications systems. A dispersion-compensating grating contains a variety of different grating periods. Often the grating is "chirped," which means that the grating period varies with distance along the fiber grating length. To obtain precise compensation of dispersion over a wide wavelength range (>100 nm), a fiber grating needs to be physically long, up to several meters.

Several methods have been proposed for fabricating fiber gratings. The fiber can be illuminated from the side with a periodic pattern of ultraviolet light, causing a permanent change in the refractive index of the fiber's photosensitive core. The resulting periodic index pattern forms the fiber grating.

For long-period gratings, the required period of the grating lies in the range 10 microns to hundreds of microns. Such gratings are used to direct light between different co-propagating modes of an optical fiber or waveguide.

For short-period gratings (Bragg gratings), the required period of the grating pattern is usually less than one micron. Such gratings are used to direct light between counterpropagating modes of an optical fiber or waveguide. For short-period gratings it is convenient to form the light pattern by the interference of two or more coherent light beams. However, the length of the interference pattern then limits the length of the grating, and in practice it is difficult to generate a high-quality interference pattern longer than a few centimeters.

Another technique for creating a Bragg grating is with the use of a linear phase mask, as described in U.S. Pat. Nos. 5,367,588 and 5,881,186. The linear phase mask is illuminated by a single light beam to generate a periodic diffraction pattern. Exposing the fiber to this periodic light pattern can create a Bragg grating in the fiber. UV light can be used to scan along the mask to write longer gratings. However, the length of the linear phase mask limits the length of the fiber grating. Presently a linear phase mask costs approximately $1,000 per centimeter, so a 1-meter long phase mask would be prohibitively expensive at this time. Another disadvantage of the linear phase mask technique for writing fiber gratings is that the period of the fiber grating is determined by the period of the phase mask, so many different phase masks are needed to produce many different fiber gratings.

An alternate method to make a long Bragg grating is to use several adjacent phase masks. In this case precise alignment of the phase masks is required and it is difficult to avoid stitching phase errors in the regions between two adjacent masks. Stitching errors degrade the spectrum of a fiber grating. The length of the linear mask array thus also limits the length of the grating with this technique usually to approximately 1 meter.

Another technique for making a long Bragg grating in an optical fiber uses a single, short, linear phase mask to expose multiple small sections of the fiber. The individual fiber Bragg gratings are then effectively stitched together to form a longer fiber Bragg grating. However this method invariably introduces stitching errors between adjacent gratings. Using a precision translation stage, one can move the fiber or the mask to minimize stitching errors. However, the necessary translation stage must have a precision of much better than 1 micron over a length greater than 1 meter, and such precision translation stages are complicated and expensive.

One can write a fiber grating by focusing a single laser beam to a small spot on the fiber. The fiber is then translated relative to the incident laser beam while modulating the intensity of the laser beam, for example by an amplitude mask. In this manner one can write a grating in the fiber point by point. In practice the technique is limited to gratings having a period of at least a few microns, for example, to long-period gratings. However, Bragg gratings designed for the telecommunications windows around 1500 nm and below require a grating period of <0.5 micron. Therefore such a point-by-point writing method may not reliably fabricate Bragg gratings for telecommunications applications.

It would be desirable to have a method of fabricating fiber gratings with any desired length, any desired variation of period along the fiber, and without stitching errors along a grating length.

SUMMARY OF THE INVENTION

The present invention includes a mask and methods of fabricating a fiber grating using such a mask. The mask of the present invention is oriented about a central point, axis, or region, and has a pattern that varies circumferentially. The mask is preferably circular, although it could also be elliptical, spherical, cylindrical, conical, or some other configuration that is oriented about a point, region, or axis. The mask can have first and second sets of alternating sections that differ from each other in one of a number of different ways, such as different thicknesses, different materials, different transmission to actinic radiation, different reflectivity, or some combination of these differences. Alternatively, the mask can have a continuously varying pattern in a circumferential direction, such as a sinusoidal variation in reflectivity in the circumferential direction.

The present invention also includes methods for forming a grating in an optical fiber by positioning the fiber near a mask with a circumferentially varying pattern, such as a circular, elliptical, spherical, cylindrical, or conical mask, and exposing the fiber to radiation to produce a grating. The fiber can be coiled next to a mask, or it can be linearly oriented. The fiber may be moved relative to the mask by moving the fiber linearly, by rotating the mask, by rotating and translating the mask, or some combination of such movements.

The invention thus includes a mask for forming a grating in an optical fiber; an assembly for forming a grating in an optical fiber including a mask and a source of radiation; a method of fabricating an unchirped or chirped fiber grating; a method of fabricating fiber gratings having different periodicities using a single phase mask; and a method of fabricating a fiber grating having an arbitrary variation of its period along its length. The systems and methods of the present invention are versatile, inexpensive, and simple to use. Further objects and advantages will become apparent from the following detailed descriptions.

BRIEF DESCRIPTION OF THE DRAWINGS

FIGS. 2(a)–2(e), is a series of cross-sectional views of various patterns in the mask.

DETAILED DESCRIPTION

Figure 1:
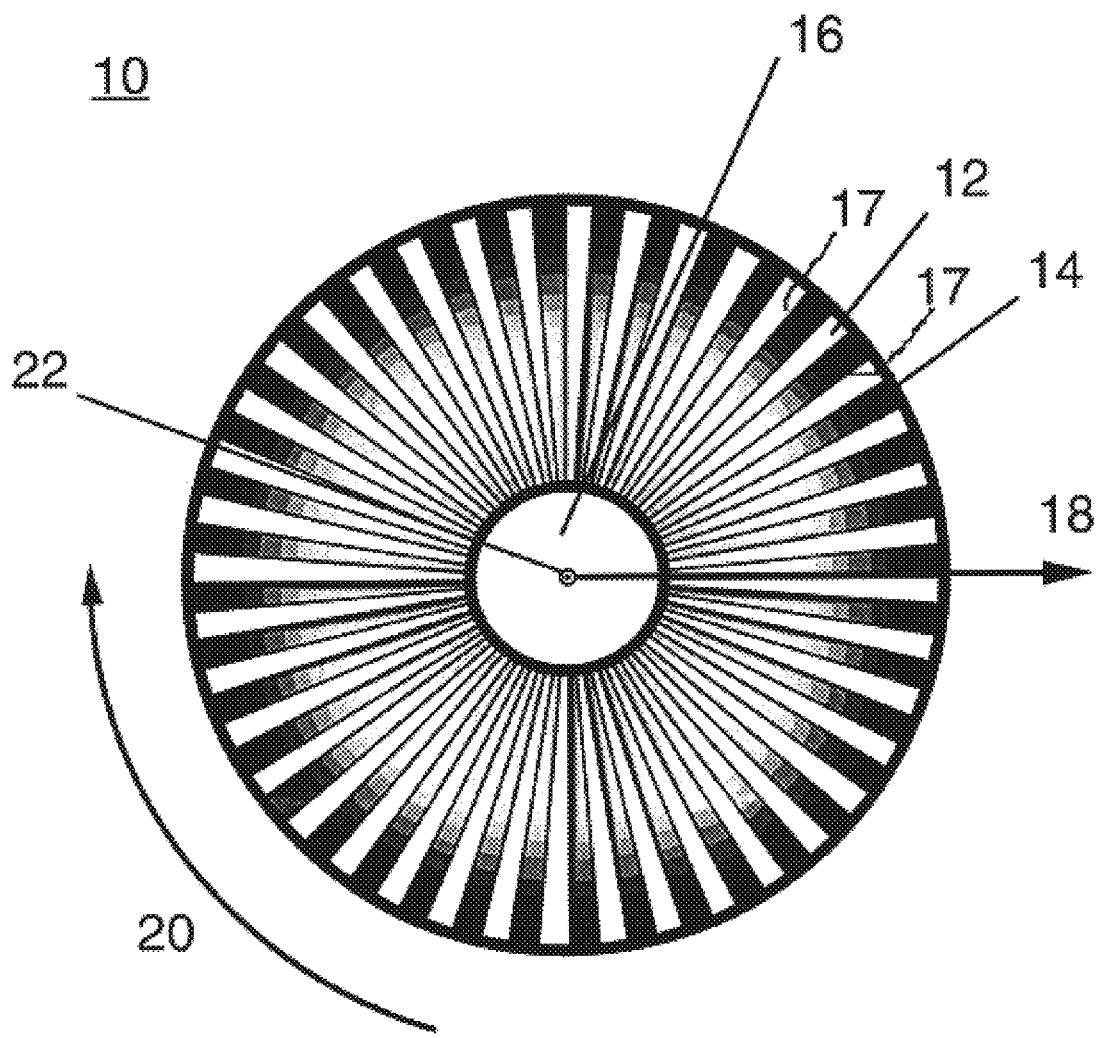
FIG. 1 is a plan view of a circular mask having a radial pattern for fiber grating fabrication.

An embodiment of the present invention is shown in FIG. 1 (not drawn to scale). A phase mask 10 for forming a grating in an optical fiber when positioned near the fiber in the presence of a source of radiation and an optical fiber has alternating sections 12 and 14. There may be many thousands of such sections arranged in an annular region of mask 10. Sections 12 are different from sections 14 in some respect, such as different optical thickness, different transmission to actinic radiation, or different reflectivity. Radially extending boundaries 17 of sections 12 and 14 can be straight lines, or they can be curved to form a spiral pattern. Near an open central region 16 of mask 10, the periods are very small. The pattern on mask 10 may or may not be constant in radial direction 18, but is varying in a circumferential direction 20. Mask 10 may have a hole at its center 22 or a solid piece with an inner radius greater than 1 mm used to hold the mask. The mask preferably has an outer radius less than 30 cm.

Figure 2:
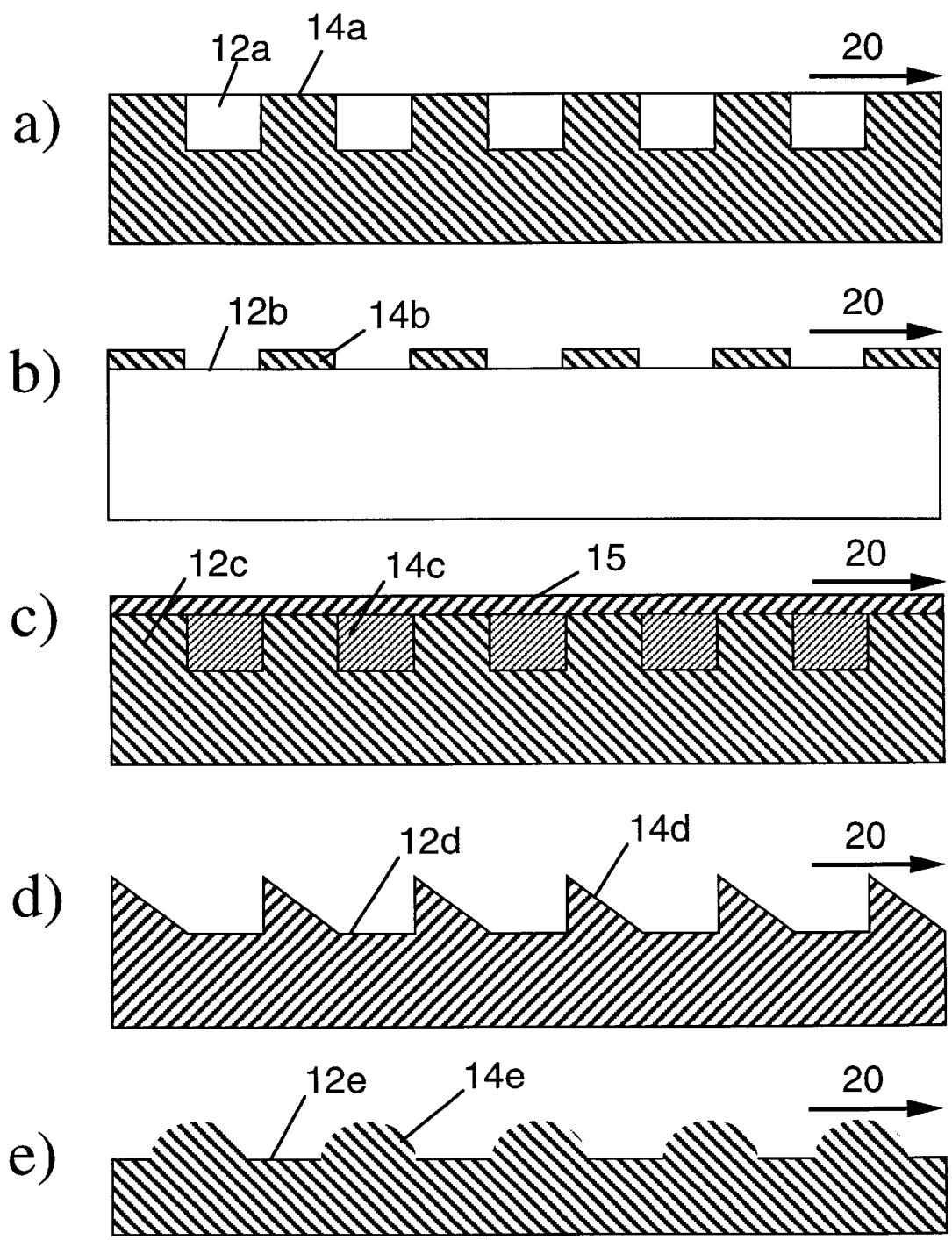
FIG. 2, including

FIG. 2 has cross-sectional views of various examples of mask patterns and construction. Note that the patterns can be aperiodic for certain applications. For example, the pattern may have overlapped modulation with several periods. Such patterns are used for writing sampled gratings.

In the embodiment shown in FIG. 2(a), sections 12a are thinner than sections 14a but all sections are constructed of the same material.

In the embodiment shown in FIG. 2(b), sections 12b and sections 14b are made of different materials. Sections 12b and 14b can have different transmission to actinic radiation, and/or could have different reflectivity if the mask works in a reflection mode.

In the embodiment shown in FIG. 2(c), sections 12c and 14c have different optical thickness. They can be made of the same anisotropic material, but adjacent sections 12c and 14c are oriented differently to produce a different refractive index. Alternatively, sections 12c and 14c can contain a different density of scratches that scatter light with different strengths. The mask can have an additional cover 15.

In the embodiment shown in FIG. 2(d), sections 14d have an optical surface whose normal is tilted with respect to the normal to the plane of the mask to have different geometry from section 12d. For example, the tilted sections could be a series of microprisms. The tilted sections 14d cause a non-uniform light pattern after the mask.

In FIG. 2(e), sections 14e and 12e represent a varying transparent element that has an optical thickness that varies along the direction 20 providing a desired light pattern after the mask. For example, the pattern could form a series of microlenses.

Sections 12a–12e and 14a–14e in the figures may not have distinct boundaries, but may continuously vary their optical properties such as absorption, thickness, refractive index, and scattering. For example, sections 12 and 14 may form a sinusoidally varying pattern of some characteristic, such as reflectivity.

Alternatively these masks can be shaped differently. Other geometries that provide a similar periodic pattern can be used in this invention, which is not limited by the planar ring geometry of FIG. 1. Some examples of other geometries are a periodic pattern on a spherical surface or on a planar ellipse. In each case, these are patterns about a central point or region or line, as opposed to a linear mask.

Figure 3:
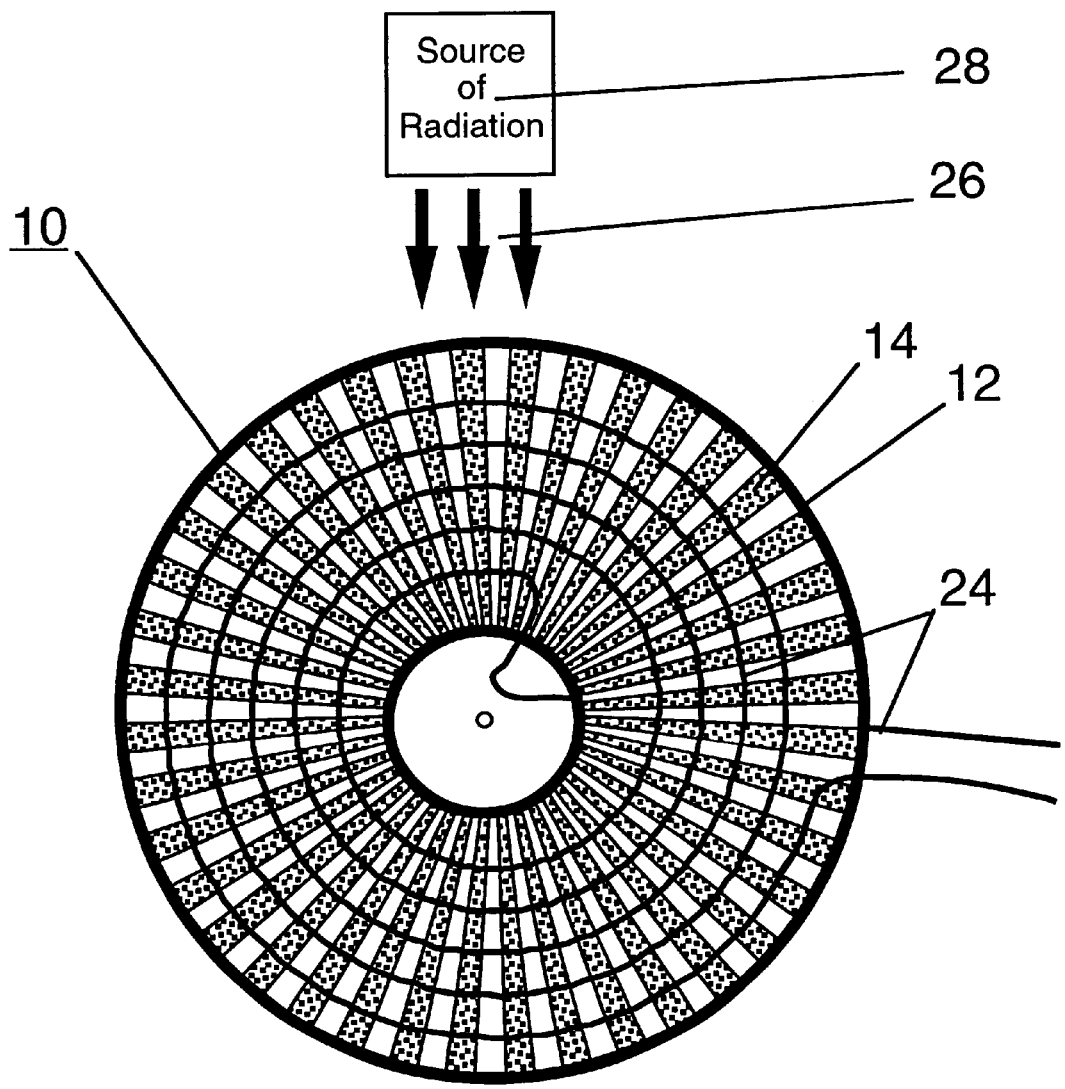
FIG. 3 shows a circular phase mask with a radial pattern and with an optical fiber coiled in a spiral and positioned to fabricate a chirped grating in the fiber.

FIG. 3 shows phase mask 10 with an optical fiber 24 coiled in a spiral and aligned to be in a plane parallel to the plane of the mask 10. Actinic radiation 26 from a source 28 passes through the mask and exposes the fiber (note that source 28 would be positioned so that radiation 26 would be normal to the plane of the page). Fiber 24 could be held in a grooved plate as a holder. There may also be a focusing element to focus the radiation onto the fiber in the groove. Alternatively, radiation can be reflected from the mask to expose the fiber. The radiation can be, for example, visible light, UV, or IR.

Figure 4:
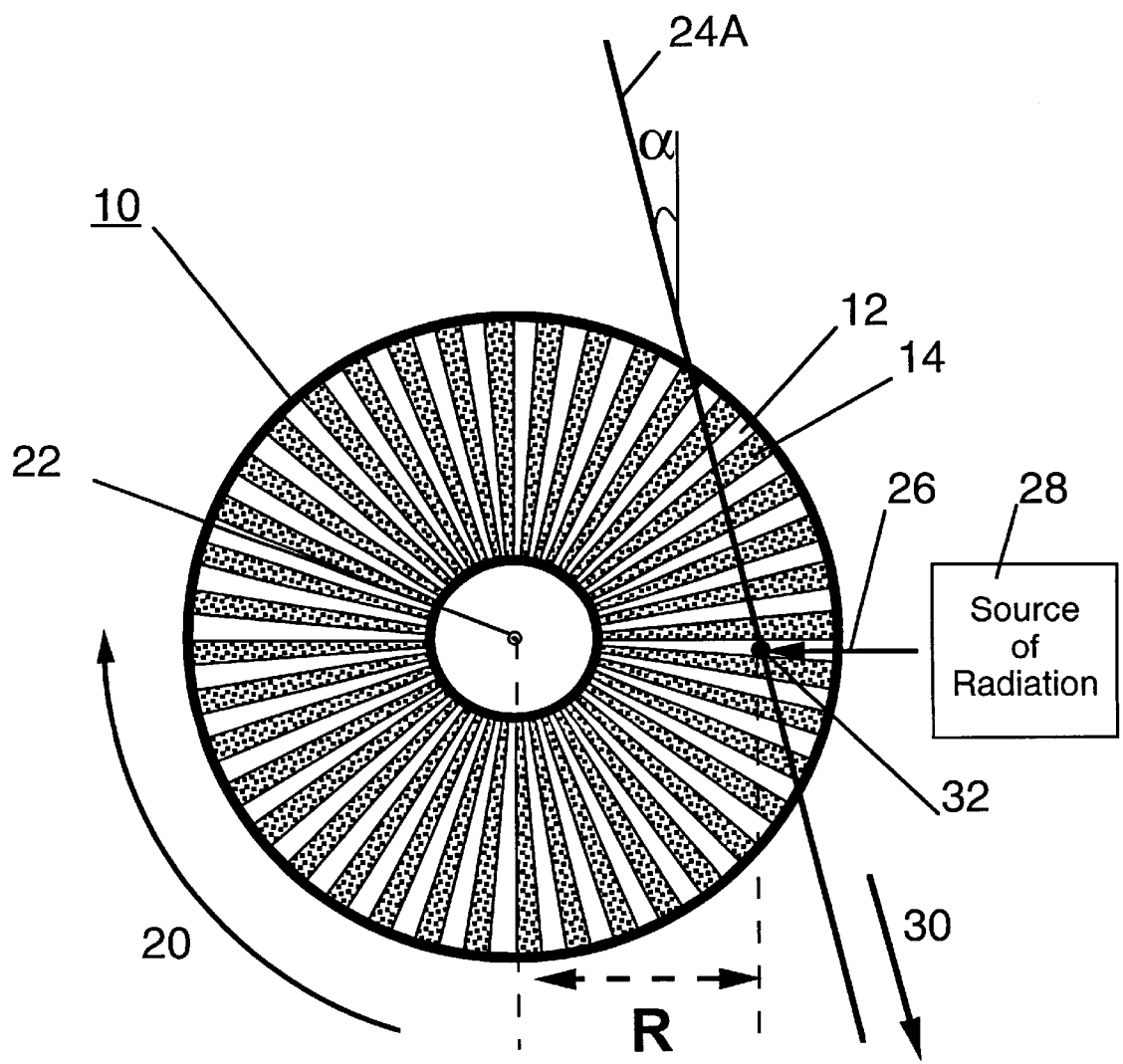
FIG. 4 shows a system for generating a continuous grating in a fiber using a radial phase mask.

FIG. 4 shows mask 10 and an optical fiber 24A aligned parallel to the plane of the mask. The fiber can be translated using some moving mechanism, such as transport wheels (not shown). The fiber is translated past mask 10, while mask 10 is free to rotate about its center 22. Center 22 can also be translated (with translation apparatus not shown) in the plane of the mask and either closer or farther from the line of the fiber. Actinic radiation 26 passes through the mask to expose the fiber.

Alternatively, a periodic pattern can be impressed into a coating of the fiber, for example, by contact with a circular continuous tool such as a gear (not shown). The periodic pattern itself can form a grating in the fiber, or actinic radiation can be then passed through the patterned coating to expose the core of the fiber.

Alternatively, the pattern in the fiber coating can be formed by selective ablation. This can speed up grating fabrication. For example, an acrylic coating of the fiber can be ablated in some locations and not in others by shining ablating UV light from an excimer laser ($\lambda$=248 nm or 193 nm) through the mask onto the fiber. The fiber grating can then be fabricated by directing writing light (for example, having a wavelength of 275 nm to 351 nm from a UV argon laser) through the patterned acrylic coating. Other combinations of ablating light and writing light can be used according to the present invention.

Figure 5:
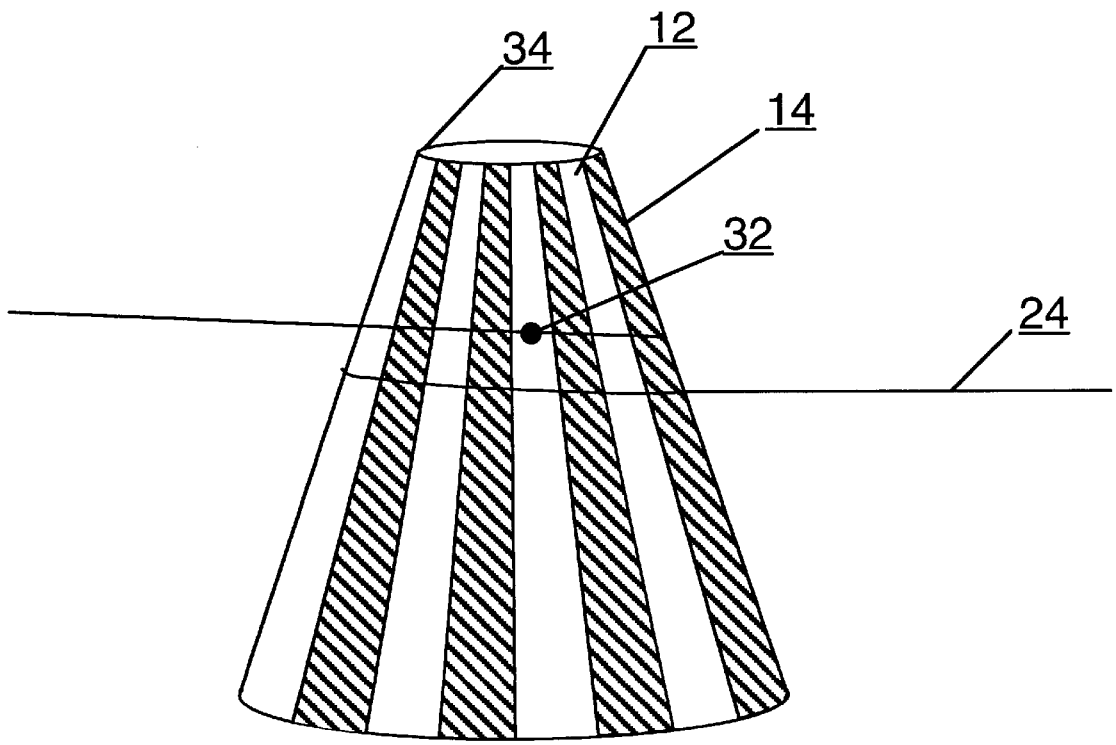
FIG. 5 shows a system for generating a continuous grating in a fiber using a conical phase mask.

The mask pattern can be formed on a cylindrical or conical element 34 shaped as a shell as shown in FIG. 5. This pattern with regions 12 and 14 can be imprinted into the fiber coating by replication. Alternatively the fiber can be exposed through such a mask to form a grating. The preferred exposure technique is for the actinic radiation to shine onto the fiber at the region 32 from inside the conical element. Fiber 24 may be wrapped around the conical element in order to ensure the simultaneous movement of the fiber and the mask.

Figure 6:
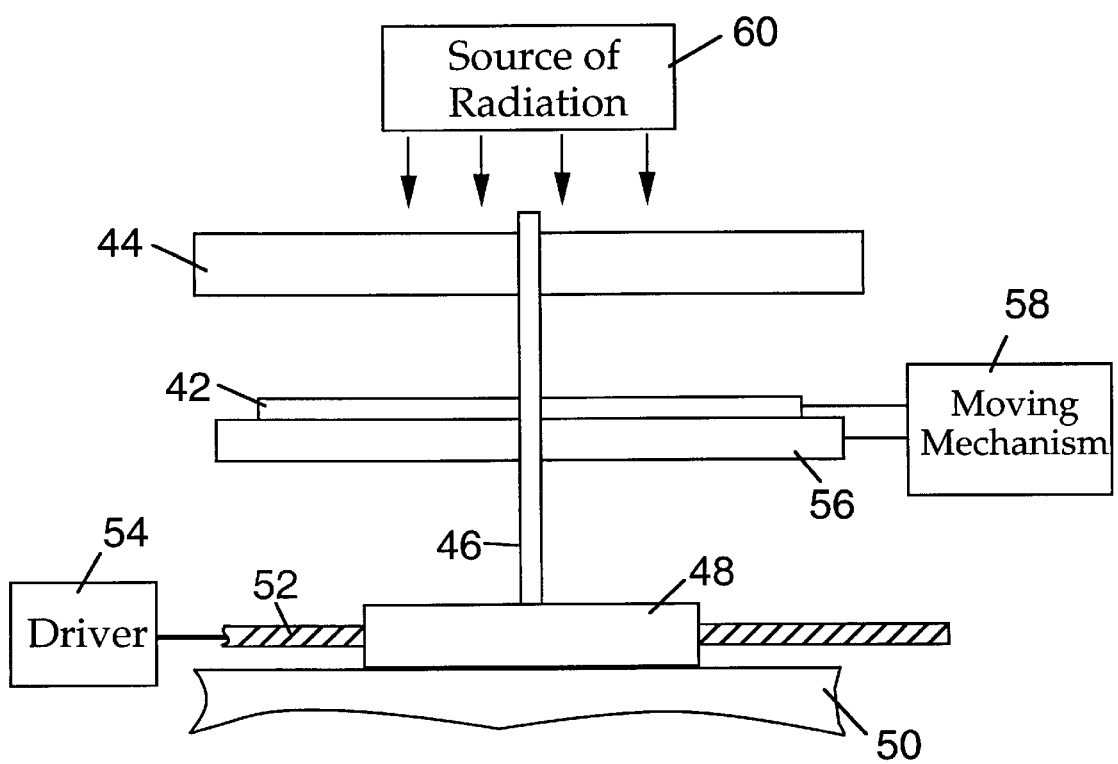
FIG. 6 is a part side, part cross-sectional view of a system for forming a grating in a fiber.

FIG. 6 shows a system 40 for forming a grating in a fiber 42. A mask 44 has a central portion connected to a spindle 46 of a turntable 48. Turntable 48 is mounted on a surface 50 over which it can move, e.g., through a lead screw 52 connected to a driver 54. Fiber 42, arranged either linearly or in a coil, is held in a holder 56. Fiber 42 and/or holder 56 can be coupled to a moving mechanism 58 that uses spools, lead screws, rollers, or some other method for moving the holder and/or fiber. Mask 44 is between a source 60 of radiation and fiber 42. Either or both of mask 44 and fiber 42 can be moved to form a grating.

To write a fiber grating with the mask of the present invention, an optical fiber is placed in proximity to the mask. Actinic radiation is directed through the mask to strike the optical fiber. The light emerging from the mask exposes the fiber and creates a grating in the fiber. Depending on the radial position of the actinic radiation with respect to the center of the mask, the period of the grating will vary. Alternatively the mask pattern can be projected from the mask onto the fiber with an additional optical system, including, but not limited to, lenses and/or mirrors. Alternatively light may be reflected from the mask onto the optical fiber. The actinic radiation can be UV light and its source can be a UV laser. Alternatively, actinic radiation can be infrared, visible, or x-ray radiation. The intensity of the actinic radiation incident on the mask can be modulated with time, for example to provide apodization of the resulting grating.

The mask can contain a superstructure and variations over its pattern. The pattern can have a modulation composed of several periods either multiplied or added, for example, for writing sampled gratings. The mask pattern can contain periodic phase shifts or variations of optical depth, for example, to provide sinc-function sampling. The resulting mask will write a sinc-sampled fiber grating that will have a series of equally strong resonance peaks. Note that the patterns can be aperiodic for certain applications.

In the embodiment shown in FIG. 3 the fiber is coiled as a spiral in the plane of the mask. The period of the radial diffraction pattern continuously increases as the distance increases from the center of the mask. Therefore, exposure of the fiber with actinic radiation through the mask generates a continuously chirped fiber grating. That is, the fiber grating will have a period that changes continuously along the length of the fiber. The spiral coiling controls the chirp of the fiber grating.

The radial pattern of the mask is chosen to obtain the desired period and chirp of the resulting fiber grating in the fiber. The chirp C is defined at the change in grating wavelength λ along a fiber length L. For a circular phase mask with a coiled fiber shown in FIG. 3, the value of C is $$C \equiv \frac{d\lambda}{dL} = \frac{ns\theta}{2\pi R} = \frac{ns\Lambda}{2\pi R^2}, \quad (1)$$

where R=radius of the fiber coil, Λ=period of the mask at the radius R, θ=angular period of the phase mask, s=separation between the center of adjacent strands of the fiber coil, and n=refractive index of the fiber core mode. For example, a phase mask having an angular period of θ=0.1 milliradian will have a Bragg grating period of 1 micron at a radius of 1 cm. This grating will be resonant for reflecting light at λ=1.5 micron in the core of an optical fiber having an effective core index n~1.5. If the fiber is wound in a tight spiral so that adjacent coils are in contact, then the separation, s, between adjacent coils will equal the diameter of the fiber. For a fiber having a plastic jacket of 250 microns in outer diameter, s=250 microns. Equation 1 then predicts a fiber grating chirp of C=0.06 microns per meter. Smaller values of C can be obtained by using a smaller angular period θ or a larger mask radius R. Larger values of C can be obtained by doing the reverse, or by using a larger separation, s, between adjacent fiber coils.

The fiber may be held onto the mask of FIG. 3 by another, unpatterned disc (not shown) to form a sandwich. By choosing the separation between the two discs to match the fiber diameter, the fiber can be coiled relatively easily onto the mask.

The laser beam can scan along the fiber. Alternatively, the beam can have a cross section sufficiently large to expose multiple sections of the fiber simultaneously, or even the entire mask and fiber at once.

FIG. 4 shows an alternate embodiment in which an optical fiber 24 is translated continuously in direction 30 relative to the mask 10. Fiber 24A is photosensitive and is exposed to actinic radiation 26 from the source 28 through the mask 10. Actinic light 26 diffracted by the phase mask into the fiber impresses a grating into the fiber. The mask is rotated around its center 22 in such a manner as to generate a continuous index pattern in the fiber. Alternatively the center of rotation can be shifted from the center 22. The velocity of the mask at the position where the actinic light interacts with the fiber can be chosen to match the velocity of the fiber. The period of the resulting grating will then be constant over the entire length of the fiber. Alternatively, the velocity of the fiber can made faster or slower to vary the period or the modulation of the resulting grating. The mask can be shifted in a radial direction to change the period of the actinic radiation pattern on the fiber. The angle α between the fiber and the normal to the mask pattern in the region of actinic radiation exposure 32 can be changed to write tilted gratings. The fiber grating is limited not by the length of the mask but only by the length of the fiber.

To create a chirped grating, where the period of the grating varies over the length of the fiber, the mask is simultaneously rotated and translated in the plane of the mask in a direction that is not along the axis of the fiber. For example, translating the mask in a direction orthogonal to the fiber axis and in the plane of the mask continuously moves the laser beam to different radial distances from the center of the mask. This movement produces a grating with different periodicity in different locations of the fiber. Alternatively, the fiber may be translated relative to the mask.

The embodiment of FIG. 4 also teaches how to fabricate Bragg gratings having different periods using only one mask. Each Bragg grating is made with the circular mask of FIG. 4 and with the distance R held fixed. The fiber is translated parallel to itself with speed v as the mask is rotated. The angular speed ω of mask rotation is chosen to be:

$$\omega = v/R. \quad (2)$$

A mechanical mechanism can be used to lock the relative movements of the mask and the fiber. Adjusting the distance R tunes the resonant wavelength $\lambda_{Bragg}$ of the resulting fiber Bragg grating according to:

$$\lambda_{Bragg} = nR\theta \quad (3)$$

where n is the index of refraction of the fiber core mode, R is the effective radius of the mask that is illuminated by the actinic radiation, and θ is the angular period of the mask sections.

Aligning the mask relative to the fiber to a new distance R alters the period of the grating. One mask can therefore contain a variety of periods sufficient to cover the entire usable spectral range of optical fibers from the ultraviolet to the far infrared region. For example, from Eq. 2, a mask with average radius 1 cm and angular period θ=0.1 milliradians will create a fiber grating with a Bragg resonance at 1.5 microns. Increasing the effective radius by a percentage p will increase the Bragg resonance by the same percentage p. Equation 3 will be altered by a magnification factor if an additional optical system is used to direct the light from the mask to the fiber.

A similar circular mask but of different physical scale can be used to fabricate fiber gratings with periods of 10 microns or more using the set up of FIG. 4. Gratings having a period greater than 10 microns are called long-period gratings as distinct from Bragg gratings which, when designed for light having a wavelength <3 micron, have a grating period less than ~1 micron. For fabrication of a long-period grating, the average period of the pattern should be of the order of tens to hundreds of microns. In this case, a radial pattern with a larger period (>10 microns) should be used. The mask can have a transmission pattern that alternately alters the phase, absorbs, reflects, or scatters the transmitted laser beam. Alternatively the mask can be made of a transparent material with radial sections that alternately deflect the laser beam. For these masks, the writing actinic radiation is directed through the mask to the fiber during one-half period of the mask, and blocked or directed away from the fiber by the mask element during the second half-period of the mask. In this manner a long-period grating is written in the fiber. An optical system can be used to direct the writing light from the mask to the fiber.

The pattern of the mask can be designed with smooth changes in its properties in order to generate a desired profile of index change in the fiber. For example, the pattern of the mask can be designed to generate a sinusoidal variation of index change in the fiber core.

Accordingly, a phase mask of the present invention can be used to fabricate a wide variety of Bragg gratings in optical fibers. The continuous mask allows to be written a wide variety of different Bragg gratings with different spatial periods using the same mask; a Bragg grating of arbitrary length in a simple and economical manner; a chirped Bragg grating in a simple and economical manner; or a long-period grating of arbitrary length.

Other embodiments are within the scope of the following claims.

What is claimed is:

1. A mask for forming a grating in an optical fiber and having a circumferentially varying pattern about a central region, wherein the pattern includes a series of alternating first and second sections with the first and second sections being made of different materials.

2. The mask of claim 1, wherein the first and second sections have different thickness.

3. A mask for forming a grating in an optical fiber and having a circumferentially varying pattern about a central region, wherein the pattern is used to form a replica pattern in the fiber coating.

4. The mask of claim 3, where the replica pattern is formed in the fiber coating by imprinting.

5. The mask of claim 3, where the replica pattern is formed in the fiber coating by ablation with ultraviolet light.

6. A mask for forming a grating in an optical fiber and having a circumferentially varying pattern about a central region, wherein the mask is circular with an open central region and having alternating first and second sections about the circumference, wherein radial boundaries between adjacent sections are curved.

7. A mask for forming a grating in an optical fiber and having a circumferentially varying pattern about a central region, wherein the pattern is continuously varying circumferentially.

8. A method of writing a grating on a fiber, the method including positioning next to a fiber a mask having a circumferentially varying pattern with alternating first and second sections, wherein the first sections and second sections are made of different materials, and introducing radiation to the mask to write a grating in the fiber.

9. The method of claim 8, further comprising positioning the mask between the optical fiber and a source of the radiation.

10. The method of claim 8, further comprising positioning the mask such that the radiation is reflected from the mask to the optical fiber.

11. The method of claim 8, wherein one of the mask and fiber is moved to produce a chirped grating in the fiber with the grating longer than 10 cm.

12. The method of claim 8, wherein the mask is rotated and the fiber is translated, and wherein the rotation and translation are synchronized.

13. The method of claim 12, wherein the fiber translation and mask rotation are performed in steps.

14. The method of claim 12, wherein the synchronization is by friction.

15. A method comprising positioning a mask having a circumferentially varying pattern next to a fiber, and using the mask to form a pattern in a coating of the fiber.

16. The method of claim 15, where the pattern is formed in the fiber coating by imprinting.

17. The method of claim 15, where the pattern is formed in the fiber coating by ablation with ultraviolet light.

18. A method of writing a grating on a fiber, the method including positioning a mask having a circumferentially varying pattern next to a fiber, and introducing radiation to the mask to write a grating in the fiber, wherein positioning is performed such that the radiation is reflected from the mask to the optical fiber.

19. An assembly comprising:
   a source of radiation;
   an optical fiber; and
   a mask for forming a grating in an optical fiber and having a circumferentially varying pattern about a central region, the mask positioned such that radiation is reflected from the mask and to the optical fiber.

20. The assembly of claim 19, wherein the source is a source of ultraviolet radiation.

21. The assembly of claim 19, wherein the source is a source of infrared radiation.

22. The assembly of claim 19, wherein the source is a source of visible light.

23. The assembly of claim 19, wherein the fiber is coiled and held in a holder.

24. The assembly of claim 23, wherein the holder has a focusing element.

25. The assembly of claim 23, wherein the holder has grooves for holding the fiber.

26. The assembly of claim 19, wherein the pattern includes a series of alternating first and second sections.

27. A mask for forming a grating in an optical fiber and having a circumferentially varying pattern about a central region, wherein the mask is elliptical.

28. The mask of claim 27, wherein the pattern includes a series of alternating first and second sections.

29. The mask of claim 28, wherein the first and second sections being made of different materials.

30. A method of writing a grating on a fiber, the method including positioning a mask having a circumferentially varying pattern next to a fiber, and introducing radiation to the mask to write a grating in the fiber, wherein the mask is oriented about a central axis, the fiber is coiled about the central axis, and the mask includes first and second sections made of different materials.

31. The method of claim 30, wherein the first and second sections also have different thickness.

32. The method of claim 30, wherein the radiation is modulated with time.

33. The method of claim 30, wherein a non-tilted grating is formed by having an axis of the fiber be perpendicular to a line from a center of the mask to the point of contact of the light and the fiber.

34. The method of claim 30, wherein the tilted grating is made by having the axis of the fiber in the plane of the mask be at an angle between 0.1 degrees to 60 degrees off of perpendicular to the line from the center of the mask to the point of contact of the light and the fiber.

* * * * *